United States Patent
Li et al.

(10) Patent No.: US 7,167,120 B1
(45) Date of Patent: Jan. 23, 2007

(54) APPARATUS FOR DIGITAL-TO-ANALOG CONVERSION AND THE METHOD THEREOF

(75) Inventors: Ming-Xian Li, Taoyuan County (TW); Jiao-Lin Huang, Taoyuan County (TW); Shih-Tao Lai, Hsinchu County (TW)

(73) Assignee: Chunghwa Picture Tubes, Ltd., Taipei (TW)

( * ) Notice: Subject to any disclaimer, the term of this patent is extended or adjusted under 35 U.S.C. 154(b) by 0 days.

(21) Appl. No.: 11/307,471

(22) Filed: Feb. 9, 2006

(51) Int. Cl.
*H03M 1/66* (2006.01)

(52) U.S. Cl. .......................... 341/145; 345/89; 345/96; 345/94; 345/99

(58) Field of Classification Search ................ 341/144; 345/94, 99, 691, 92, 98, 87, 89, 96, 69, 204, 345/208; 349/149
See application file for complete search history.

(56) References Cited

U.S. PATENT DOCUMENTS

| | | | | |
|---|---|---|---|---|
| 5,206,633 A * | 4/1993 | Zalph | ........................ | 345/92 |
| 5,229,761 A * | 7/1993 | Fuse | ........................ | 345/99 |
| 5,666,132 A | 9/1997 | Ochi et al. | ........................ | 345/96 |
| 6,049,319 A * | 4/2000 | Sakamoto et al. | ........................ | 345/94 |
| 6,157,360 A * | 12/2000 | Jeong et al. | ........................ | 345/98 |
| 6,661,402 B1 * | 12/2003 | Nitta et al. | ........................ | 345/99 |
| 6,791,521 B1 * | 9/2004 | Isami et al. | ........................ | 345/89 |
| 6,831,621 B1 * | 12/2004 | Nakano | ........................ | 345/87 |
| 6,947,060 B1 * | 9/2005 | Abe | ........................ | 345/691 |
| 7,030,869 B1 * | 4/2006 | Morita | ........................ | 345/208 |
| 2002/0080107 A1 * | 6/2002 | Fujimoto et al. | ........................ | 345/87 |
| 2002/0180680 A1 * | 12/2002 | Moon | ........................ | 345/89 |
| 2003/0107698 A1 * | 6/2003 | Nagayama et al. | ........................ | 349/149 |
| 2003/0156086 A1 * | 8/2003 | Maeda et al. | ........................ | 345/89 |
| 2004/0012580 A1 * | 1/2004 | Yamagishi et al. | ........................ | 345/204 |
| 2004/0263540 A1 * | 12/2004 | Ooishi et al. | ........................ | 345/690 |
| 2005/0024312 A1 * | 2/2005 | Isami et al. | ........................ | 345/89 |
| 2005/0116654 A1 * | 6/2005 | Sato et al. | ........................ | 315/169.2 |
| 2005/0156850 A1 * | 7/2005 | Morita | ........................ | 345/96 |

FOREIGN PATENT DOCUMENTS

JP      05-323283      12/1993

\* cited by examiner

*Primary Examiner*—Jean Bruner Jeanglaude
(74) *Attorney, Agent, or Firm*—Jianq Chyun IP Office

(57) ABSTRACT

An apparatus for digital-to-analog conversion and the method thereof is disclosed, wherein the complete scale-tuned levels of more bits may be presented with an output of less bits. The apparatus comprises a timing controller, a scale-tuned circuit and a digital-to-analog converter. The timing controller receives an a-bit grayscale value, and outputs a selection signal and a b-bit control signal, wherein a, b are both positive integers and a>b>=1. The selection signal has two states: if the grayscale value is less than or equal to $2^a - 2^c$, wherein c is equal to a−b, the selection signal is in a first state; and if the grayscale value is equal to $2^a - 2^c + n$, wherein n is an integer and $0 < n < 2^c$, the selection signal has a probability of $n/2^c$ to be in a second state, and has a probability of $1 - n/2^c$ to be in the first state.

18 Claims, 5 Drawing Sheets

| Scale tuned voltages | Grayscale control signal |
|---|---|
| V0 | 0000000 |
| V4 | 0000001 |
| V8 | 0000010 |
| ⋮ | ⋮ |
| V100 | 0011001 |
| V104 | 0011010 |
| ⋮ | ⋮ |
| V248 | 0111110 |
| V252 | 0111111 |
| V256 | 1XXXXXX |

FIG. 4A

| 100 | 104 |
|---|---|
| 104 | 104 |

FIG. 4B

| 252 | 252 |
|---|---|
| 252 | 256 |

FIG. 4C

| 252 | 256 |
|---|---|
| 256 | 252 |

FIG. 4D

| 252 | 256 |
|---|---|
| 256 | 256 |

FIG. 4E

APPARATUS FOR DIGITAL-TO-ANALOG CONVERSION AND THE METHOD THEREOF

BACKGROUND OF THE INVENTION

1. Field of Invention

The present invention relates to an apparatus for digital-to-analog conversion and the method thereof. More particularly, the present invention relates to an apparatus for digital-to-analog conversion comprising a grayscale dithering and the method thereof.

2. Description of Related Art

A conventional grayscale display technique of a thin film transistor liquid crystal display (referred as TFT LCD for short) is to use a timing controller to make a 6-bit source driver circuit generate an approximately 8-bit grayscale effect in a grayscale dithering manner. The grayscale dithering may be classified as a time averaging and a space averaging. Because human eyes have an effect of calculating averages automatically, the displayed screen may be seen to have finer and smoother scale-tuned levels, as long as signals are output in different time scales or space scales.

FIG. 1 is a scale-tuned circuit diagram of a conventional 6-bit source driver circuit, wherein 64 scale-tuned voltages (V0~V252) may be generated by using divider resistances (R0~R62) to divide the voltages. FIG. 2 is a circuit diagram of a digital-to-analog converter of the conventional 6-bit source driver circuit, wherein the on and off of switches is controlled by control signals (D0~D5) respectively, thereby forming 64 conducting paths controlled by the control signals (D0~D5). Each conducting path is electrically connected to 64 scale-tuned voltages (V0~V252), which are the same as the scale-tuned voltages (V0~V252) of the circuit shown in FIG. 1. Through the control signals (D0~D5), the corresponding scale-tuned voltages (V0~V252) may be output as an output signal "output" via an output buffer 210.

The output signal "output" may provide any of the 64 different scale-tuned voltages as required. The digital-to-analog converter in FIG. 2 is combined with a timing controller (referred as T-con for short) having a grayscale dithering function. For a single color, the original 64 tuned scales may be raised to 253 tuned scales, but it still cannot achieve the complete 8-bit tuned scales, i.e. 256 tuned scales. The three primary colors displayed with 253 tuned scales may be combined to a color level of 253*253*253≈16.2M, but it still cannot achieve a color effect displayed directly by the 8-bit tuned scales 256*256*256≈16.7M. If the shortage of grayscale tuned scales is to be overcome directly by an 8-bit source driver, the complexity and cost of the circuit will be raised significantly.

SUMMARY OF THE INVENTION

Accordingly, the present invention is directed to provide an apparatus for digital-to-analog conversion, wherein using an improved grayscale dithering algorithm, the complete scale-tuned levels of more bits may be generated by a source driver circuit of less bits without raising the complexity and cost of the source diver circuit significantly.

The present invention is further directed to provide a method for digital-to-analog conversion, wherein using an improved grayscale dithering algorithm, the complete scale-tuned levels of more bits may be presented by scale-tuned voltages of less bits without raising the complexity and cost of the source diver circuit significantly.

To achieve the above and other objects, the present invention provides an apparatus for digital-to-analog conversion, comprising a timing controller, a scale-tuned circuit, and a digital-to-analog converter. The timing controller receives an a-bit grayscale value, and outputs a selection signal and a b-bit control signal. The control signal is the result output by the timing controller performing the grayscale dithering algorithm from a-bit to b-bit on the received grayscale value, wherein a, b are both positive integers and a>b>=1. The selection signal has two states: if the grayscale value to be output by the display is less than or equal to $2^a-2^c$, wherein c is equal to a−b, the selection signal is in a first state; and if the grayscale value is equal to $2^a-2^c+n$, wherein n is an integer and $0<n<2^c$, the selection signal has a probability of $n/2^c$ to be in a second state, and has a probability of $1-n/2^c$ to be in the first state. When the selection signal is in the first state, the digital-to-analog converter outputs a corresponding scale-tuned voltage $V(s\times 2^c)$ to its output terminal according to the b-bit control signal, wherein s is the value of the b-bit control signal. When the selection signal is in the second state, the digital-to-analog converter outputs the scale-tuned voltage $V(2^a)$ to its output terminal. The scale-tuned circuit is composed of $2^b$ resistors, and generates $2^b+1$ scale-tuned voltages by using the resistors to divide voltages, wherein V0 is the lowest scale-tuned voltage, $V(2^c)$ is the second lowest scale-tuned voltage, and $V(2^a)$ is the highest scale-tuned voltage. The $i^{th}$ resistor in the above scale-tuned circuit is electrically connected between the scale-tuned voltage $V((i-1)\times 2^c)$ and the scale-tuned voltage $V(i\times 2^c)$, wherein i is an integer and $1<=i<=2^b$.

In an embodiment, the digital-to-analog converter, the output buffer circuit and the scale-tuned circuit described above are all included in a source diver circuit of a TFT LCD. Wherein, the output buffer is electrically connected to the output terminal of the digital-to-analog converter. The digital-to-analog converter comprises a selection circuit, a first switch and a second switch, wherein the selection circuit is responsible for receiving the control signal and the scale-tuned voltages other than the highest scale-tuned voltage $V(2^a)$. If the control signal value is s, the scale-tuned voltage $V(s\times 2^c)$ corresponding to the control signal value is output. If the selection signal is in the first state, the first switch is switched on between the output terminal of the selection circuit and the output terminal of the digital-to-analog converter. If the selection signal is in the second state, the second switch is switched on between the scale-tuned voltage $V(2^a)$ corresponding to the second state and the output terminal of the digital-to-analog converter. Furthermore, each switch within said digital-to-analog converter comprises a PMOS transistor (P channel metal oxide semiconductor transistor, referred as PMOS for short) and an NMOS transistor (N channel metal oxide semiconductor transistor, referred as NMOS for short), and the PMOS and the NMOS are used as electrically conducting paths of high and low potentials, respectively.

As seen from another aspect, the present invention further provides a method for digital-to-analog conversion, which comprises the following steps: at first, receiving an a-bit grayscale value, and providing a selection signal and a b-bit control signal, wherein a, b are both positive integers and a>b>=1, and the control signal is obtained by performing a grayscale dithering algorithm from a-bit to b-bit on the grayscale value, if the grayscale value is less than or equal to $2^a-2^c$, in which c is equal to a−b, the selection signal is in a first state, and if the grayscale value is equal to $2^a-2^c+n$, in which n is an integer and $0<n<2^c$, the selection signal has a probability of $n/2^c$ to be in a second state, and has a probability of $1-n/2^c$ to be in the first state; then, providing $2^b+1$ scale-tuned voltages, wherein V0 is the lowest scale-tuned voltage, $V(2^c)$ is the second lowest scale-tuned voltage, $V(2^a)$ is the highest scale-tuned voltage; and assuming the control signal value to be s, wherein if the selection signal is in the first state, the scale-tuned voltage $V(s \times 2^c)$ corresponding to the first state is output, and if the selection signal is in the second state, the scale-tuned voltage $V(2^a)$ corresponding to the second state is output.

As described in the preferred embodiments of the present invention, in the present invention, an internal resistance is added to the scale-tuned circuit, with a more scale-tuned voltage compared to a conventional scale-tuned circuit, and new switches are added to the digital-to-analog converter, such that the b-bit source diver circuit may provide any of the $2^b+1$ scale-tuned voltages according to the selection signal and the control signal. By combined with the improved grayscale dithering function of the timing controller, a scale-tuned voltage with a resolution of b bits may be output, thereby achieving the complete scale-tuned levels of a bits without losing the highest scale-tuned levels while the conventional technique would. Wherein, a and b are both positive integers and a>b>=1. As the main modification is to add an internal resistance and two switches, it only needs to modify the scale-tuned circuit and the digital-to-analog converter slightly as so to achieve the effect of adding scale-tuned levels in the present invention without raising the complexity and cost of the source diver circuit significantly.

In order to make the aforementioned and other objects, features and advantages of the present invention comprehensible, a preferred embodiment accompanied with figures is described in detail below.

It is to be understood that both the foregoing general description and the following detailed description are exemplary, and are intended to provide further explanation of the invention as claimed.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the theorems of the invention.

FIG. 4A is an output list of grayscale control signals and scale-tuned voltages according to one embodiment of the present invention.

FIGS. 4B~4E are combinations of the scale-tuned voltages according to one embodiment of the present invention.

DESCRIPTION OF EMBODIMENTS

Figure 1:
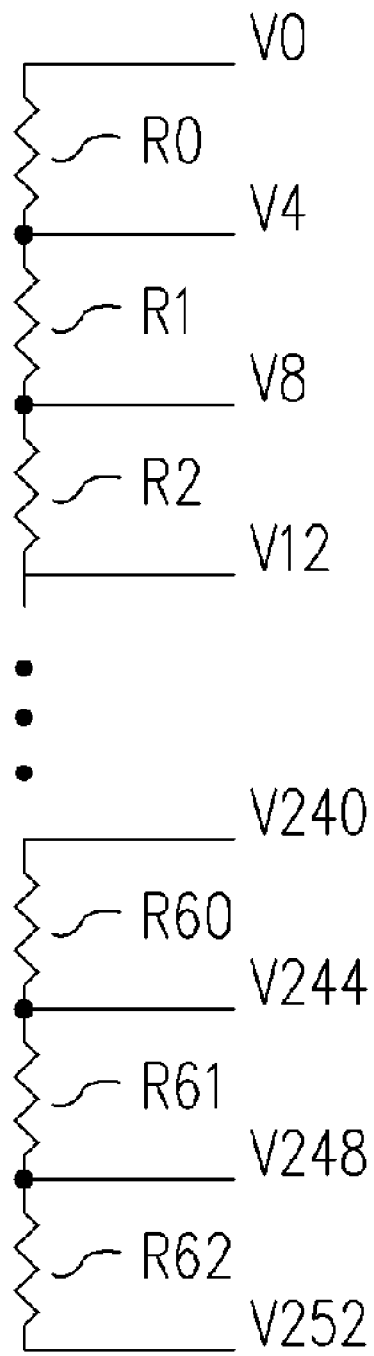
FIG. 1 is a scale-tuned circuit diagram of a 6-bit source diver circuit of a conventional technique.
Figure 2:
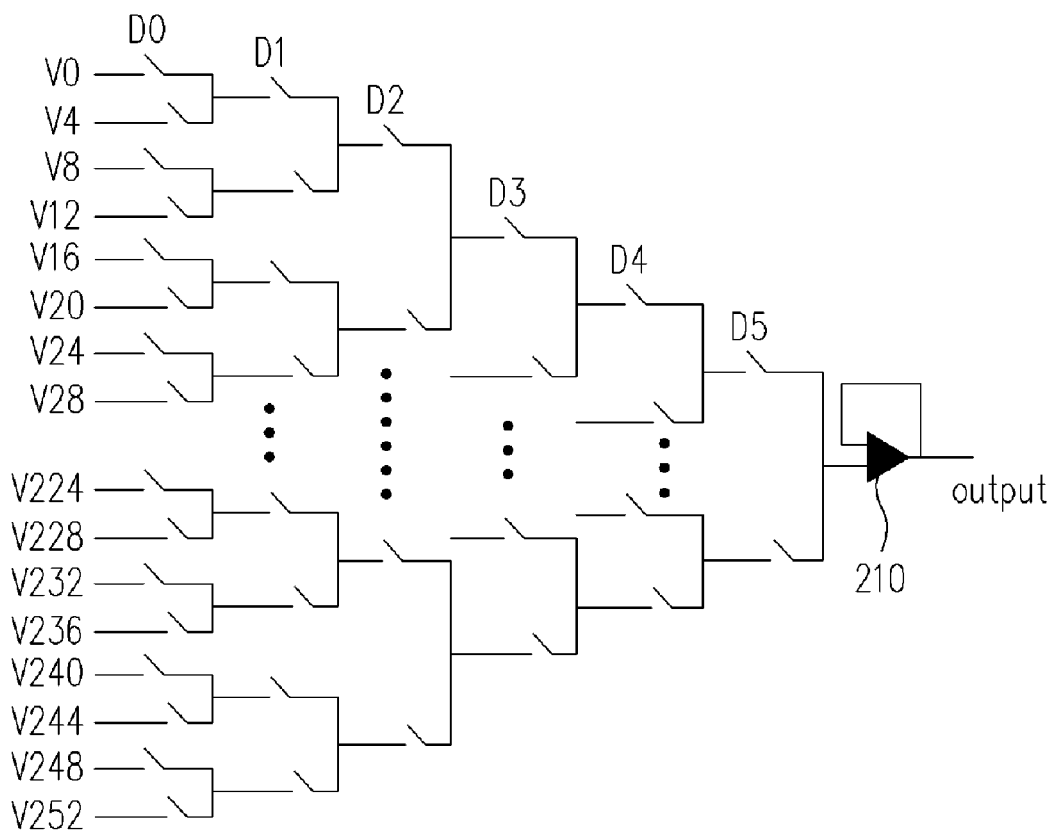
FIG. 2 is a circuit diagram of a digital-to-analog converter of the 6-bit source diver circuit of the conventional technique.
Figure 3:
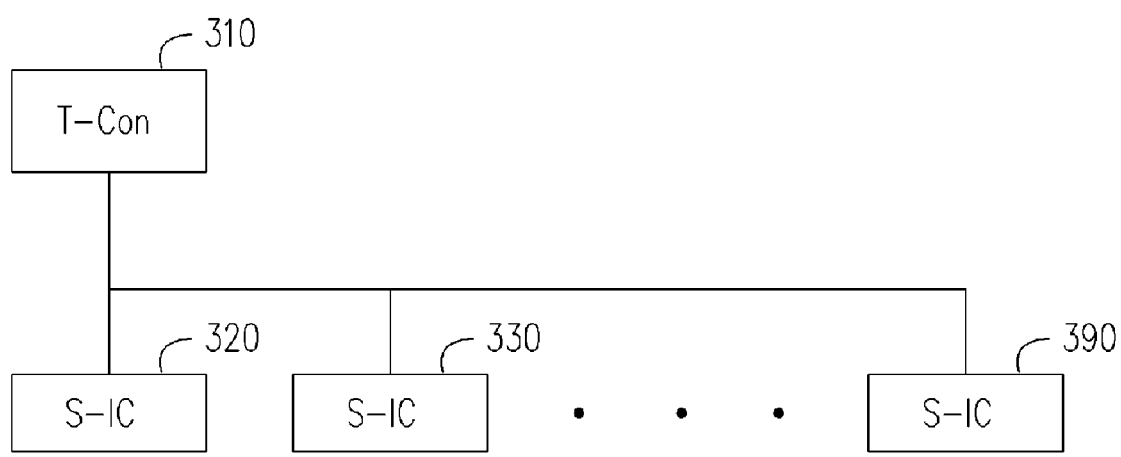
FIG. 3 is a schematic view of an apparatus for digital-to-analog conversion according to one embodiment of the present invention.

As described above, the present invention is to achieve a grayscale display effect through a timing controller (T-con) used with a source diver circuit. FIG. 3 is a schematic view of an apparatus for digital-to-analog conversion according to one embodiment of the present invention. The circuit in FIG. 3 is included in a driver circuit of a thin film transistor liquid crystal display (TFT LCD), wherein the T-con 310 is electrically connected to source drivers (320~390), respectively. The T-con 310 receives an 8-bit grayscale value, and outputs a 7-bit grayscale control signal to the source diver circuits (320~390) through a grayscale dithering operation from 8-bit to 6-bit, respectively. Such a 7-bit grayscale control signal comprises a selection signal and control signals. The most significant bit of the 7-bit grayscale control signal is D6, representing the logic state of the selection signal D6, and the other 6 bits (D0~D5) represent the logic states of the control signals (D0~D5) respectively, wherein the most significant bit is D5, and the least significant bit is D0.

The source drivers (320~390) output the corresponding scale-tuned voltages according to the grayscale control signals. An output list of their grayscale control signals and the corresponding scale-tuned voltages is shown in FIG. 4A. The grayscale control signals corresponding to the scale-tuned voltages (V0~V252) are 0000000~0111111, and the grayscale control signal corresponding to the scale-tuned voltage V256 is 1XXXXXX, which may be any set of logic signals between 1000000~1111111. The scale-tuned voltages (V0~V256) represent the scale-tuned voltage values (0~256) respectively. When the selection signal is in the first state (logic 0 in this embodiment), each grayscale control signal corresponds to one of the scale-tuned voltages (V0~V252). When the selection signal is in the second state (logic 1 in this embodiment), the corresponding scale-tuned voltage V256 is output. When the grayscale value received by the T-con 310 is less than or equal to 252, for example, the grayscale value is equal to 103, the scale-tuned voltages output by the source diver circuit 320 are the same as those of the conventional technique. As shown in FIG. 4B, the scale-tuned voltages are 100, 104, 104 and 104, respectively, and the average thereof is 103. When the grayscale value received by the T-con 310 is equal to 252+n, wherein n is an integer and 0<n<4, the selection signal has a probability of n/4 to be in the second state, and has a probability of 1−n/4 to be in the first state. Take the grayscale value being 253 for example, the scale-tuned voltage values output by the source diver circuit 320 are 252, 252, 252 and 256 respectively, as shown in FIG. 4C, and the average thereof is 253. In such a way, when the grayscale values are 254 and 255, the scale-tuned voltage values output by the source diver circuit 320 are shown in FIGS. 4D and 4E, respectively, and will not be described again. As known from the above illustration, the conventional grayscale dithering algorithm can only present 253 tuned scales from 0 to 252, while the improved grayscale dithering algorithm of this embodiment may present 256 complete tuned scales from 0 to 255. The functions of the source diver circuits (330~390) in the circuit are similar to the source diver circuit 320, and may be readily understood by those skilled in the art from the disclosure described above, and thus will not be described repeatedly.

Figure 5:
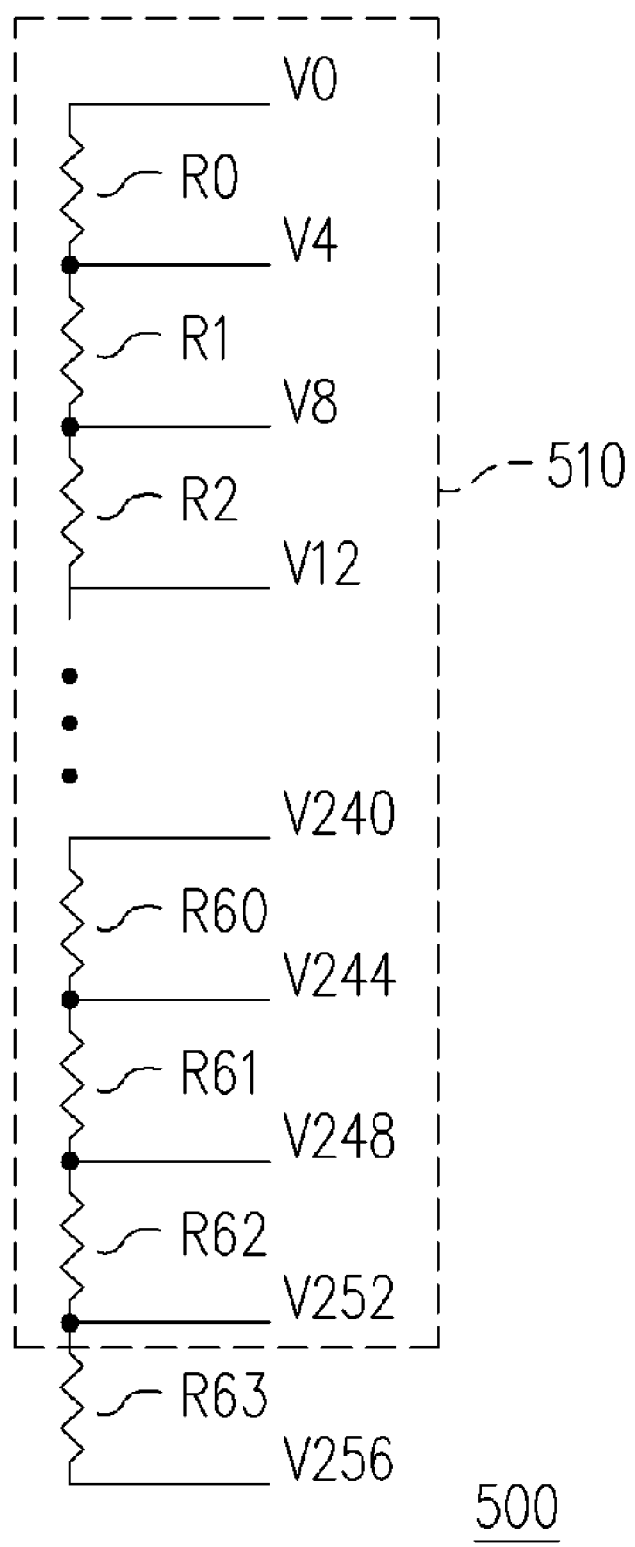
FIG. 5 is a scale-tuned circuit diagram of a source driver according to one embodiment of the present invention.

In this embodiment, each source diver circuit (320~390) comprises a scale-tuned circuit and a digital-to-analog converter. FIG. 5 is a scale-tuned circuit diagram of a source diver circuit according to this embodiment. An ordinary 6-bit scale-tuned circuit 510 has only 63 divider resistances (R0~R62), and according to the theorem of voltage division, 64 scale-tuned voltages (V0~V252) may be obtained. In this embodiment, a divider resistance R63 is added so as to form a scale-tuned circuit 500, such that the output scale-tuned voltage is increased to 65 scale-tuned voltages (V0~V256).

Figure 6:
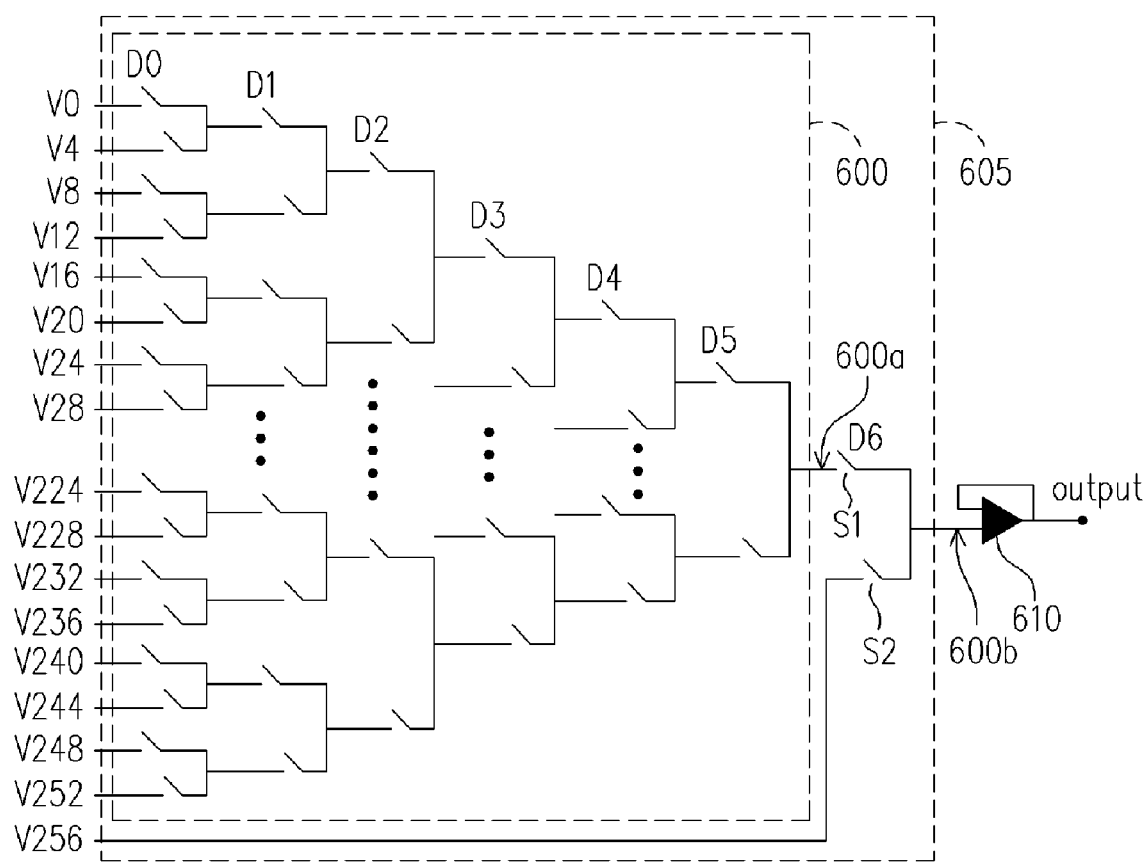
FIG. 6 is a circuit diagram of a digital-to-analog converter and an output buffer according to one embodiment of the present invention.

FIG. 6 shows a digital-to-analog converter and an output buffer according to this embodiment. The digital-to-analog converter 605 includes a selection circuit 600, a first switch S1, and a second switch S2. The first switch S1 is electrically connected between an output terminal 600a of the selection circuit 600 and an output terminal 600b of the digital-to-analog converter 605. The second switch S2 is electrically connected between the scale-tuned voltage V256 and the output terminal 600b of the digital-to-analog converter 605. The output buffer 610 is electrically connected to the output terminal 600b of the digital-to-analog converter 605 to provide an output signal "output". The selection circuit 600 described above comprises a plurality of switches, which is 126 switches in this embodiment. Each switch in the digital-to-analog converter 605 comprises a PMOS transistor and an NMOS transistor, which are used as electrically conducting paths of high and low potentials, respectively. The control signals (D0~D5) are a 6-bit digital signal, wherein the most significant bit is D5, and the least significant bit is D0. The selection circuit 600 controls the on and off of each switch therein according to the control signals (D0~D5) respectively, thereby forming 64 electrically conducting paths corresponding to the control signals (D0~D5). Each conducting path is electrically connected to one of the 64 scale-tuned voltages (V0~V252) and the output terminal 600a of the selection circuit 600, respectively. In other words, the selection circuit 600 receives the control signals (D0~D5) and the scale-tuned voltages (V0~V252). If the control signal value is s, the scale-tuned voltage V(s×4) is output. For example, if the control signals (D0~D5) are equal to 0, the scale-tuned voltage V0 is output by the selection circuit 600; and if the control signals (D0~D5) are equal to 26, the scale-tuned voltage V104 is output by the selection circuit 600. The selection signal D6 provides two states: when it is in a first state, the first switch S1 is switched on between the output terminal 600a of the selection circuit 600 and the output terminal 600b of the digital-to-analog converter 605, and the digital-to-analog converter 605 outputs the scale-tuned voltage V(s×4) according to the received control signal value s; when the selection signal D6 is in a second state, the second switch S2 is switched on between the scale-tuned voltage V256 corresponding to the second state and the output terminal 600b of the digital-to-analog converter, and the digital-to-analog converter 605 outputs the scale-tuned voltage V256. In this embodiment, the first state of said selection signal D6 is logic 0, and the second state is logic 1. In another embodiment, the first state is logic 1, and the second state is logic 0.

The present invention is not only useful for presenting the complete gray scales of 8-bit with a 6-bit resolution, but may also be extended to present the complete gray scales of 10-bit with a 8-bit resolution, or be further extended to present the complete gray scales of a bits with a b-bit resolution, in which a and b are both positive integers and a>b>=1. If the embodiment in FIGS. 3~6 is extended, the T-con 310 receives an a-bit grayscale value, which is a grayscale signal to be output by the display. After a grayscale dithering operation through the T-con 310, a selection signal and a b-bit control signal are output. The selection signal comprises two states, a first state and a second state, and these two states may be logic 1 and logic 0, respectively, and vice versa.

If the a-bit grayscale value is less than or equal to $2^a-2^c$, in which c is equal to a−b, the selection signal is in the first state. At that time, the a-bit grayscale value may be represented as $m \times 2^c+n$, in which m is an integer greater than or equal to 0, n is an integer and $0<n<2^c$. At that time, the control signal value has a probability of $n/2^c$ to be equal to m+1, and has a probability of $1-n/2^c$ to be equal to m. In other words, even when the scale-tuned circuit cannot directly output a scale-tuned voltage, which fits a grayscale value, an average scale-tuned voltage fitting said grayscale value is presented by using two scale-tuned voltages closest to the grayscale value in a manner of time averaging or space averaging.

On the other hand, if the a-bit grayscale value is equal to $2^a-2^c+n$, wherein n is an integer and $0<n<2^c$, the selection signal has a probability of $n/2^c$ to be in the second state, and has a probability of $1-n/2^c$ to be in the first state. The source diver circuits (320~390) output the corresponding scale-tuned voltages according to the received selection signal and control signals.

Each source diver circuit (320~390) comprises a scale-tuned circuit, a digital-to-analog converter, and an output buffer. The extended scale-tuned circuit 500 has $2^b$ divider resistances, and may provide $2^b+1$ scale-tuned voltages, wherein V0 is the lowest scale-tuned voltage, $V(2^c)$ is the second lowest scale-tuned voltage, and $V(2^a)$ is the highest scale-tuned voltage. The extended digital-to-analog converter 605 receives a selection signal, a control signal and scale-tuned voltages $V0\sim V(2^a)$, wherein the extended selection circuit 600 receives all the scale-tuned voltages except the highest scale-tuned voltage $V(2^a)$. If the control signal value is set to be s, the extended selection circuit 600 outputs the corresponding scale-tuned voltage $V(s \times 2^c)$ according to the control signal value s. When the selection signal is in the first state, the scale-tuned voltage $V(s \times 2^c)$ corresponding to the first state becomes an output signal "output" of the digital-to-analog converter 605 via the first switched-on switch S1. When the selection signal is in the second state, the highest scale-tuned voltage $V(2^a)$ corresponding to the second state becomes an output signal "output" via the second switched-on switch S2. In other words, through the change of the control signals and the selection signal, the T-con 310 may control the source diver circuits (320~390) to output the required scale-tuned voltages in a grayscale dithering manner respectively, so as to present an grayscale display effect of more bits with an output resolution of less bits.

In the extended embodiment, the scale-tuned circuit, the digital-to-analog converter, and the output buffer circuit are all included in a source diver circuit of a TFT LCD. The output buffer is electrically connected to the output terminal of the digital-to-analog converter. Said scale-tuned circuit further comprises $2^b$ resistors, and may provide $2^b+1$ scale-tuned voltages by using the theorem of voltage division, wherein the $i^{th}$ resistor is electrically connected between the scale-tuned voltage $V((i-1) \times 2^c)$ and the scale-tuned voltage $V(i \times 2^c)$, in which i is an integer and $1<=i<=2^b$. Furthermore, said digital-to-analog converter further comprises a selection circuit, a first switch, and a second switch. The selection circuit is responsible for receiving the control signal and all the scale-tuned voltages except the highest scale-tuned voltage $V(2^a)$. If the control signal value is s, the scale-tuned voltage $V(s \times 2^c)$ corresponding to the control signal value is output. If the selection signal is in the first state, the first switch is switched on between the output terminal of the selection circuit and the output terminal of the digital-to-analog converter. If the selection signal is in the second state, the second switch is switched on between the scale-tuned voltage $V(2^a)$ corresponding to the second state and the output terminal of the digital-to-analog converter.

Besides the above embodiments of the apparatus, the present invention further provides a method for digital-to-analog conversion. The detail of the method has been included in the above embodiments of the apparatus. This method for digital-to-analog conversion may be readily practiced by one of ordinary skill in the art from the disclosure of the above embodiments of the apparatus, and therefore will not be described here again.

As described above, in the present invention, an internal resistance is added to the scale-tuned circuit, with a more scale-tuned voltage compared to the conventional scale-tuned circuit, and new switches are added to the digital-to-analog converter, such that the b-bit source diver circuit may provide any of the $2^b+1$ scale-tuned voltages according to the selection signal and the control signal. By combined with the improved grayscale dithering function of the timing controller, a scale-tuned voltage with a resolution of b bits may be output, thereby achieving the complete scale-tuned levels of a bits without losing the highest scale-tuned levels while the conventional technique would. Wherein, a and b are both positive integers and a>b>=1. As the main modification is to add an internal resistance and two switches, it only needs to modify the scale-tuned circuit and the digital-to-analog converter slightly to achieve the effect of adding scale-tuned levels in the present invention without raising the complexity and the cost of the source diver circuit significantly.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. An apparatus for digital-to-analog conversion, comprising:
    a timing controller, for receiving a grayscale value of a bits, and outputting a selection signal and a control signal of b bits, wherein a, b are both positive integers and a>b>=1, and the control signal is obtained by performing a grayscale dithering algorithm from a-bit to b-bit on the grayscale value, if the grayscale value is less than or equal to $2^a-2^c$, in which c is equal to a–b, the selection signal is in a first state, and if the grayscale value is equal to $2^a-2^c+n$, in which n is an integer and $0<n<2^c$, the selection signal has a probability of $n/2^c$ to be in a second state, and has a probability of $1-n/2^c$ to be in the first state;
    a scale-tuned circuit, for providing $2^b+1$ scale-tuned voltages, of which V0 is the lowest scale-tuned voltage, $V(2^c)$ is the second lowest scale-tuned voltage, and $V(2^a)$ is the highest scale-tuned voltage; and
    a digital-to-analog converter, for receiving the selection signal, the control signal and the scale-tuned voltages, outputting the scale-tuned voltage $V(s \times 2^c)$ corresponding to the first state if the selection signal is in the first state and the control signal value is s, and outputting the scale-tuned voltage $V(2^a)$ corresponding to the second state if the selection signal is in the second state, wherein s is the value of the control signal.

2. The apparatus for digital-to-analog conversion as claimed in claim 1, wherein if the grayscale value is less than $2^a-2^c$ and the grayscale value is equal to $m \times 2^c+n$, in which m is an integer greater than or equal to 0, the control signal value has a probability of $n/2^c$ to be equal to m+1, and has a probability of $1-n/2^c$ to be equal to m.

3. The apparatus for digital-to-analog conversion as claimed in claim 1, wherein the scale-tuned circuit and the digital-to-analog converter are included in a source diver circuit of a thin film transistor liquid crystal display.

4. The apparatus for digital-to-analog conversion as claimed in claim 1, further comprising an output buffer, electrically connected to the output terminal of the digital-to-analog converter.

5. The apparatus for digital-to-analog conversion as claimed in claim 4, wherein the scale-tuned circuit, the digital-to-analog converter and the output buffer are included in a source diver circuit of a thin film transistor liquid crystal display.

6. The apparatus for digital-to-analog conversion as claimed in claim 1, wherein the scale-tuned circuit comprises $2^b$ resistors, and wherein the $i^{th}$ resistor is electrically connected between the scale-tuned voltage $V((i-1) \times 2^c)$ and the scale-tuned voltage $V(i \times 2^c)$, in which i is an integer and $1<=i<=2^b$.

7. The apparatus for digital-to-analog conversion as claimed in claim 1, wherein the digital-to-analog converter comprises:
    a selection circuit, for receiving the control signal and the scale-tuned voltages other than the highest scale-tuned voltage $V(2^a)$, wherein if the control signal value is s, the scale-tuned voltage $V(s \times 2^c)$ corresponding to the control signal value is output;
    a first switch, switched on between the output terminal of the selection circuit and the output terminal of the digital-to-analog converter if the selection signal is in the first state; and
    a second switch, switched on between the scale-tuned voltage $V(2^a)$ corresponding to the second state and the output terminal of the digital-to-analog converter if the selection signal is in the second state.

8. The apparatus for digital-to-analog conversion as claimed in claim 7, wherein each switch within the digital-to-analog converter comprises a PMOS transistor and an NMOS transistor.

9. The apparatus for digital-to-analog conversion as claimed in claim 1, wherein a is equal to 8 and b is equal to 6.

10. The apparatus for digital-to-analog conversion as claimed in claim 1, wherein a is equal to 10 and b is equal to 8.

11. The apparatus for digital-to-analog conversion as claimed in claim 1, wherein the first state is logic 0, and the second state is logic 1.

12. The apparatus for digital-to-analog conversion as claimed in claim 1, wherein the first state is logic 1, and the second state is logic 0.

13. A method for digital-to-analog conversion, comprising the following steps:
    receiving a grayscale value of a bits, and providing a selection signal and a control signal of b bits, in which a and b are both positive integers and a>b>=1, and the control signal is obtained by performing a grayscale dithering algorithm form a-bit to b-bit on the grayscale value, wherein if the grayscale value is less than or equal to $2^a-2^c$, in which c is equal to a–b, the selection signal is in a first state, and if the grayscale value is equal to $2^a-2^c+n$, in which n is an integer and $0<n<2^c$, the selection signal has a probability of $n/2^c$ to be in a second state, and has a probability of $1-n/2^c$ to be in the first state;

providing $2^b+1$ scale-tuned voltages, of which V0 is the lowest scale-tuned voltage, $V(2^c)$ is the second lowest scale-tuned voltage, and $V(2^a)$ is the highest scale-tuned voltage; and assuming the control signal value to be s, wherein if the selection signal is in the first state, the scale-tuned voltage $V(s \times 2^c)$ corresponding to the first state is output, and if the selection signal is in the second state, the scale-tuned voltage $V(2^a)$ corresponding to the second state is output.

14. The method for digital-to-analog conversion as claimed in claim 13, wherein if the grayscale value is less than $2^a-2^c$ and the grayscale value is equal to $m \times 2^c+n$, in which m is an integer greater than or equal to 0, the control signal value has a probability of $n/2^c$ to be equal to m+1, and has a probability of $1-n/2^c$ to be equal to m.

15. The method for digital-to-analog conversion as claimed in claim 13, wherein a is equal to 8 and b is equal to 6.

16. The method for digital-to-analog conversion as claimed in claim 13, wherein a is equal to 10 and b is equal to 8.

17. The method for digital-to-analog conversion as claimed in claim 13, wherein the first state is logic 0, and the second state is logic 1.

18. The method for digital-to-analog conversion as claimed in claim 13, wherein the first state is logic 1, and the second state is logic 0.

\* \* \* \* \*